United States Patent
Kim et al.

(10) Patent No.: US 6,730,555 B2
(45) Date of Patent: May 4, 2004

(54) TRANSISTORS HAVING SELECTIVELY DOPED CHANNEL REGIONS

(75) Inventors: Youngmin Kim, Allen, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 10/153,033

(22) Filed: May 22, 2002

(65) Prior Publication Data

US 2002/0182793 A1 Dec. 5, 2002

Related U.S. Application Data

(60) Provisional application No. 60/294,305, filed on May 29, 2001.

(51) Int. Cl.[7] .......................................... H01L 21/8238
(52) U.S. Cl. ...................... 438/217; 438/221; 438/276; 438/289; 438/296

(58) Field of Search .................................. 438/199, 207, 438/217, 218, 219, 221, 276, 289, 291, 296, 353

(56) References Cited

U.S. PATENT DOCUMENTS 6,187,643 B1 * 2/2001 Borland ...................... 438/302
6,583,013 B1 * 6/2003 Rodder et al. ............... 438/276

FOREIGN PATENT DOCUMENTS

EP        0 643 417 A2 * 3/1995   ....... H01L/21/3215

* cited by examiner

*Primary Examiner*—Minh-Loan Tran
(74) *Attorney, Agent, or Firm*—Peter K. McLarty; W. James Brady, III; Frederick J. Telecky, Jr.

(57) ABSTRACT

An integrated semiconductor system is provided that is formed on a substrate 10. A dual implant mask 26 is used to change the characteristics of semiconductor devices formed in regions of the substrate 10 having different characteristics. Transistors 50 and 52 can be formed on the same substrate 10 and have different electrical characteristics.

17 Claims, 1 Drawing Sheet

TRANSISTORS HAVING SELECTIVELY DOPED CHANNEL REGIONS

This application claims priority under 35 USC § 119(e)(1) of provisional application No. 60/294,305 filed May 29, 2001.

TECHNICAL FIELD OF THE INVENTION

This invention relates in general to the field of electronic devices and more particularly to a method of forming transistors having selectively doped channel regions.

BACKGROUND OF THE INVENTION

One of the ways in which the complexity of integrated circuits has increased over time is the combination of different types of devices on a single substrate. For example, different types of transistors may be formed on the same integrated circuit substrate in order to provide for complex functionality from the system. For example, high speed digital transistors may be formed on the same substrate as analog devices. These transistors may have different tasks to perform in the integrated system and therefore need to have different electronic characteristics in order to perform those tasks in an optimal manner. Prior techniques have used masks which shield one type of transistor during the formation of another. These masks increase the cost and complexity of the steps needed to form the integrated systems.

SUMMARY OF THE INVENTION

Accordingly, a need has arisen for an integrated system and method of formation which allows for the creation of different types of transistors and devices on a single substrate without the need for additional mask steps.

In accordance with the teachings of the present invention, a method of forming different types of transistors on a single substrate is provided that substantially eliminates or reduces disadvantages and problems associated with prior techniques.

According to one embodiment of the present invention, a method for forming a plurality of transistors on a single semiconductor substrate is provided that comprises forming a plurality of active regions in the substrate having at least two conductivity types. A conductive gate layer is then formed outwardly from the active regions. A dual implant mask is then formed outwardly from the conductive gate so that it shields selected ones of the active regions and does not shield others. A through gate implant process is then performed using the dual mask so that the channel regions of some of the active regions are affected by the through gate implant and the channel regions of the active regions shielded by the through gate implant mask are not affected substantially by the through gate implant. A gate implant step is also performed using the same dual implant mask.

An important technical advantage of certain embodiments of the present invention inheres in the fact that the use of a dual implant mask allows for the creation of particular types of transistors with particular electronic characteristics and provides a gate implant step without the need for an additional mask step.

BRIEF DESCRIPTION OF THE DRAWINGS

A more complete understanding of the present invention may be acquired by referring to the accompanying figures in which like reference numbers indicate like features and wherein.

DETAILED DESCRIPTION OF THE DRAWINGS

Figure 1:
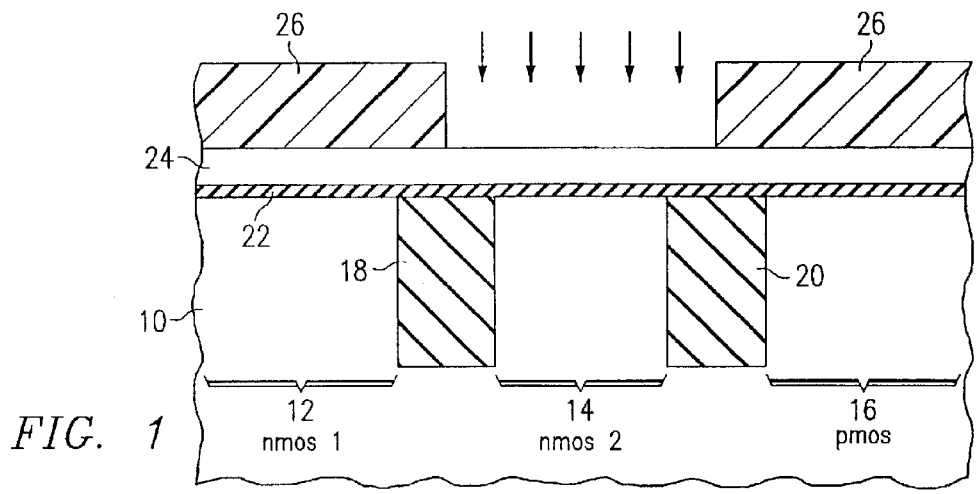
FIG. 1 is a greatly-enlarged, cross-sectional, elevational, schematic diagram illustrating one embodiment of the method of the present invention.

Referring to FIG. 1, a semiconductor substrate indicated generally at 10 is separated into three different active regions, first NMOS region 12, second NMOS region 14 and PMOS region 16. Regions 12 and 14 are separated by trench isolation region 18 and regions 14 and 16 are separated by a trench isolation region 20. Isolation regions 18 and 20 comprise trenches formed in the outer surface of substrate 10 which are then filled with an insulator or combination of insulating layers such as silicon dioxide, silicon nitride, or other suitable insulative materials. NMOS regions 12 and 14 are doped with P-type ions such as boron to a concentration on the order of 1E16 ions per cubic centimeter. Accordingly, regions 12 and 14 provide locations for the formation of N-channel transistors and other devices which utilize P-type semiconductor substrates in their channels. In comparison, region 16 provides a location for P-channel devices and is therefore doped with arsenic or phosphorous ions to a concentration on the order of 1E16 ions per cubic centimeter.

A gate oxide layer 22 is formed on the outer surface of substrate 10 covering regions 12, 14 and 16. Further, a gate conductor layer 24 is formed outwardly from gate insulator layer 22. Gate insulator layer 22 may comprise, for example, a layer of silicon dioxide or silicon nitride or a combination of layers of oxide and nitride formed to an effective thickness of on the order of 25 Angstroms. Gate conductor layer 24 may comprise, for example, a layer on the order of 1600 Angstroms in thickness of polycrystalline silicon.

Referring again to FIG. 1, a dual implant mask 26 is shown formed outwardly from portions of the outer surface of gate conductor layer 24. Dual implant mask 26 may comprise, for example, a photoresist layer. In conventional systems, an implant mask is typically used to cover all of the P-channel devices or all of the N-channel devices at one time. In conventional methodologies, this allows for the independent adjustment of the conductivity of the channel regions of the N-channel and P-channel devices. In contrast, according to the teachings of the present invention, the dual implant mask 26 can be used to create transistors of different types with differing operating characteristics within the same conductivity type by allowing for a through gate implant step and a gate implant step using the same mask. As such, dual implant mask 26 covers PMOS region 16 and also covers first NMOS region 12. As such, only second NMOS region 14 will be exposed to the ionic bombardment associated with a through gate implant process performed using the dual implant mask 26. It should be understood that the regions illustrated in the figures are purely exemplary and presented for purposes of teaching the present invention and should not be construed to limit the scope of the present invention in any way. For example, the teachings of the present invention would typically apply to many different NMOS regions and PMOS regions that may be separated widely on a single semiconductor substrate. Accordingly, through gate implant mask 26 is typically a complex structure covering various structures disposed over the surface of a complex integrated system.

According to one embodiment of the present invention, the through gate implant process involves the implantation of phosphorous ions at a dose of 1E12 ions per square centimeter at an energy of 150 keV. According to this embodiment, following the implantation process, the first NMOS region 12 would remain at an ion concentration of 1E16 ions per cubic centimeter. Similarly the PMOS region 16 would remain with a concentration of arsenic ions on the order of 1E16 ions per cubic centimeter. However, the second NMOS region 14 would be changed from a prior concentration of 1E16 boron ions per cubic centimeter to an effective concentration of 5E15 ions per cubic centimeter. In this manner, the transistors which will eventually be formed in region 14 can have a different threshold voltage characteristic than the transistors that will be formed in region 12. This may be important, for example, if the transistors in region 14 are high speed logic devices and the transistors in region 12 are, for example, high density but lower speed digital devices such as those that may be used to form a static random access memory cell. The adjustment of the threshold voltage by the adjustment of the conductivity of the substrate is only one example of the differentiating factors that could be accomplished using the dual implant mask 26 as described herein. For example, other implantation steps or etching steps may be used to differentiate types of transistors within region 14 from different types of transistors within region 12. The dual implant mask 26 may also be used to perform a gate implant step to render exposed portions of gate conductor layer 24 conductive. For example, the implantation of phosphorous ions at an energy of 20 keV and a dose of 5E15 ions per square centimeter or arsenic ions at the same dosage but an energy of 50 keV can be used. In this manner, a single mask can be used for two implant processes to create transistors with different operating characteristics. The portions of gate conductor layer 24 covered by mask 26 can be rendered sufficiently conductive by later implant steps such as conventional source/drain implant processes.

Figure 2:
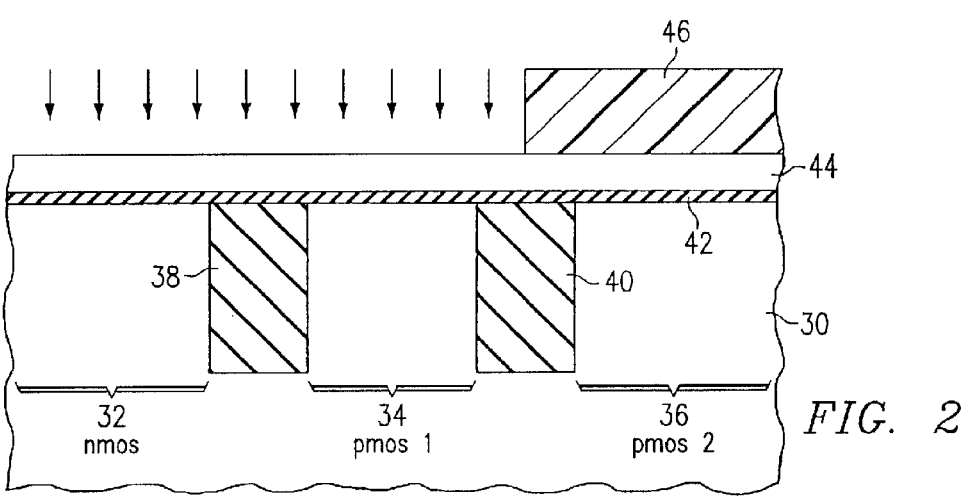
FIG. 2 is a greatly-enlarged, cross-sectional, elevational, schematic diagram illustrating a second embodiment of the method of the present invention.

Referring to FIG. 2, a semiconductor substrate 30 is divided into three regions, an NMOS region 32, a first PMOS region 34 and a second PMOS region 36. Regions 32 and 34 are separated by a trench isolation region 38. Regions 34 and 36 are separated by a trench isolation region 40. Regions 38 and 40 are substantially identical to regions 18 and 20 discussed previously. Regions 32, 34 and 36 each comprise a starting ion concentration of on the order of 1E16 ions per cubic centimeter. In the case of region 32 the ions are boron ions and in the cases of regions 34 and 36 the ions are arsenic or phosphorous ions. On the outer surface of substrate 30 is formed a gate oxide layer 42 and a gate conductor layer 44. Layers 42 and 44 are substantially identical to layers 22 and 24, respectively discussed previously with reference to FIG. 1. A dual implant mask 46 is formed outwardly from the outer surface of gate conductor layer 44. Dual implant mask is substantially identical in structure to dual implant mask 26. Both masks 26 and 46 may comprise photoresist material which has been photolithographically patterned, developed and cured to result in the structure shown in FIGS. 1 and 2.

As discussed previously, conventional methods of forming transistors on a substrate use the implant masks to cover all of the transistors which are formed in a single conductivity type. For example, all of the PMOS structures would be covered and the NMOS regions would be treated with an ion implant process. According to the teachings of the present invention, in contrast, dual implant mask 46 covers second PMOS region 36 but leaves NMOS region 32 and first PMOS region 34 uncovered and open to a through gate implant process and a gate implant process, both of which use the same mask. According to one embodiment of the present invention, a through gate implant process comprising boron ions at a dose of 1E12 ions per square centimeter and an energy of 55 keV may be used to adjust the conductivity of the channel regions within regions 32 and 34 leaving region 36 substantially unaffected. Using this implant process, the effective ion density within region 32 will raise to on the order of 5E16 ions per cubic centimeter. In contrast, the effective ion density within first PMOS region 34 will lowered to on the order of 5E15 arsenic ions per cubic centimeter. In this manner, a through gate implant of an opposite species can be used to adjust the effective ion density within a region of the substrate having an opposite conductivity type. Using this technique, transistors having different characteristics such as threshold voltage or other conductivity characteristics can be formed in regions 32, 34 and 36 all of which will have different conductivity profiles within the channel regions of the transistors. The same gate implant process discussed with reference to FIG. 1 previously may be used to render the exposed regions of gate conductor layer 44 conductive. Once again, both the gate implant process and the through gate implant process may advantageously use the same dual mask layer 46.

Figure 3:
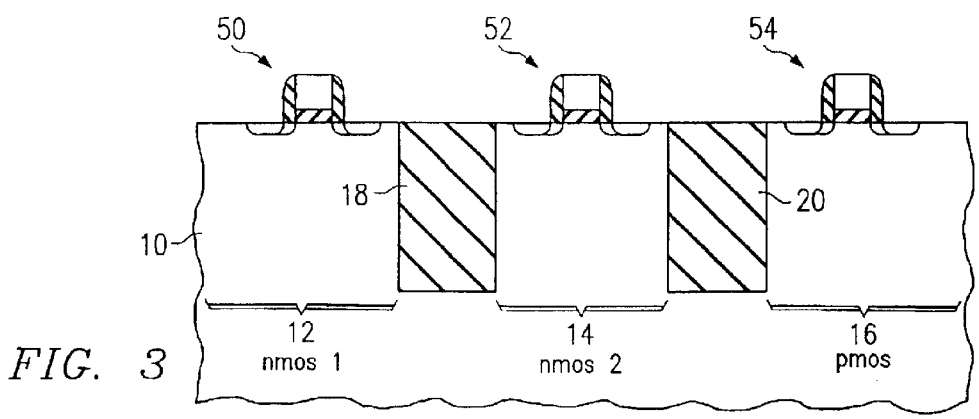
FIG. 3 is a greatly-enlarged, cross-sectional, elevational, schematic diagram illustrating substantially finished transistors constructed according to the method of the present invention.

FIG. 3 is a cross-sectional diagram which illustrates the substantially finished transistors constructed in the various regions discussed with reference to FIG. 1 previously. Using the techniques of the present invention a field effect transistor 50 may be completed in first NMOS region 12. Similarly, field effect transistors 52 and 54 may be completed in regions 14 and 16, respectively. As discussed previously, field effect transistor 50 is an N-channel device which has a different threshold voltage than the N-channel device 52 constructed in region 14 because of the fact that the through gate implant affected the conductivity of the substrate 10 within region 14 but did not affect the conductivity of the substrate 10 within region 12 through the operation of dual implant mask 26. In this manner, a single substrate 10 can support P-channel device 54 and two different types of N-channel devices 50 and 52 all on a single substrate. Using the techniques in the specific examples described with reference to FIG. 1, the threshold voltage of this specific embodiment can easily be as much as 150 millivolts different between device 50 and 52 due to the different character of the substrate within the channels of these devices. This distinction can be very useful in designing particular types of circuits where different devices are needed in different areas of the transistor. For example, N-channel device 50 could be an analog device or a transistor within a static random access memory cell and N-channel device 52 could be a high speed logic device within a single chip which includes both high speed logic devices and analog or static memory cells.

Accordingly, the method and system of the present invention utilize a single dual purpose and mask through gate implant processes and gate implant processes to create transistors having disparate capabilities and characteristics on the same integrated substrate. In this manner, separate or additional masks need not be included in the formation process greatly saving time, money and complication within the device.

Although the present invention has been described in detail it should be understood that various alterations, changes, modifications and substitutions may be made to the teachings described herein without departing from the scope of the present invention which is solely defined by the appended claims.

What is claimed is:

1. A method for forming an electronic system comprising:
   providing a substrate having a plurality of active regions wherein at least one of said plurality of active regions comprises a first conductivity type and at least one of said plurality of active regions comprises a second conductivity type;
   forming a gate conductor layer insulatively disposed outwardly from an outer surface of the substrate, the gate conductor layer covering at least some of the active regions;
   forming a dual implant mask covering all of the active regions having a first conductivity type and at least some of the active regions of the second conductivity type;
   implanting ionic impurities through the gate conductor and into the semiconductor substrate within the active regions not covered by the dual implant mask; and
   implanting ionic impurities into the portions of the gate conductor not covered by the dual implant mask.

2. The method of claim 1, wherein the regions of a first conductivity type comprise regions comprising P-type ionic impurities and the regions of the second conductivity type comprise regions comprising N-type ionic impurities.

3. The method of claim 2, wherein the P-type ionic impurities comprise boron or BF2.

4. The method of claim 2, wherein the N-type ionic impurities comprise phosphorous or arsenic.

5. The method of claim 1 and further comprising:
   forming a field effect transistor in an active region subjected to an implant process; and
   forming a field effect transistor in an active region guarded from the implant process by the dual implant mask.

6. The method of claim 1 and further comprising the step of defining the active regions by forming trench isolation regions separating the active regions from one another.

7. The method of claim 1 and further comprising the step of forming a gate oxide layer on the outer surface of the substrate prior to forming the gate conductor layer, one of the implant processes operable to implant ions through the gate conductor layer and the gate oxide layer into the substrate inwardly from the gate oxide layer.

8. The method of claim 1, wherein the step of forming a gate conductor layer comprises the step of forming a layer of polycrystalline silicon and doping the polycrystalline silicon layer so as to render it substantially conductive.

9. A method of forming an electronic system comprising:
   providing a substrate having a plurality of active regions wherein at least one of said plurality of active regions comprises a first conductivity type and at least one of said plurality of active regions comprises a second conductivity type;
   forming a gate conductor layer insulatively disposed outwardly from an outer surface of the substrate, the gate conductor layer covering at least some of the active regions;
   forming a dual implant mask covering at least one but not all of the active regions having a first conductivity type and at least one but not all of the active regions of the second conductivity type;
   implanting ionic impurities through the gate conductor and into the semiconductor substrate within the active regions not covered by the dual implant mask; and
   implanting ionic impurities into the portions of the gate conductor not covered by the dual implant mask.

10. The method of claim 9, wherein the regions of a first conductivity type comprise P-type ionic impurities and the regions of the second conductivity type comprise regions having N-type ionic impurities.

11. The method of claim 10, wherein the P-type ionic impurities comprise boron.

12. The method of claim 10, wherein the N-type ionic impurities comprise phosphorous or arsenic.

13. The method of claim 9 and further comprising:
   forming a field effect transistor in an active region subjected to an implant process; and
   forming a field effect transistor in an active region guarded from the implant process by the dual implant mask.

14. The method of claim 9 and further comprising the step of defining the active regions by forming trench isolation regions separating the active regions from one another.

15. The method of claim 9 and further comprising the step of forming a gate oxide layer on the outer surface of the substrate prior to forming the gate conductor layer, one of the implant processes operable to implant ions through the gate conductor layer and the gate oxide layer into the substrate inwardly from the gate oxide layer.

16. The method of claim 9, wherein the step of forming a gate conductor layer comprises the step of forming a layer of polycrystalline silicon and doping the polycrystalline silicon layer so as to render it substantially conductive.

17. A method for forming an electronic system comprising:
   providing a substrate having a plurality of active regions wherein at least one of said plurality of active regions comprises a first conductivity type and at least one of said plurality of active regions comprises a second conductivity type said active regions defined by trench isolation regions separating the active regions from one another;
   forming a gate oxide layer on the outer surface of the substrate;
   forming a gate conductor layer outwardly from outer surface of the gate oxide layer, the gate conductor layer covering at least some of the active regions;
   forming a dual implant mask covering all of the active regions having a first conductivity type and at least some of the active regions of the second conductivity type;
   implanting ionic impurities through the gate conductor and into the semiconductor substrate within the active regions not covered by the dual implant mask, the through gate implant process operable to implant ions through the gate conductor layer and the gate oxide layer into the substrate inwardly from the gate oxide layer;
   implanting ionic impurities into the portions of the gate conductor not covered by the dual implant mask;
   forming a field effect transistor in an active region subjected to the through gate implant process; and
   forming a field effect transistor in an active region guarded from the through gate implant process by the through gate implant mask.

* * * * *